(12) United States Patent
Fang et al.

(10) Patent No.: US 10,287,444 B2
(45) Date of Patent: May 14, 2019

(54) EMI SHIELDING COMPOSITION AND PROCESS FOR APPLYING IT

(71) Applicant: HENKEL AG & CO. KGAA, Duesseldorf (DE)

(72) Inventors: Wangsheng Fang, Shanghai (CN); Wei Yao, Shanghai (CN)

(73) Assignee: HENKEL AG & CO. KGAA, Duesseldorf (DE)

( * ) Notice: Subject to any disclaimer, the term of this patent is extended or adjusted under 35 U.S.C. 154(b) by 0 days.

(21) Appl. No.: 15/296,178

(22) Filed: Oct. 18, 2016

(65) Prior Publication Data

US 2017/0037261 A1 Feb. 9, 2017

Related U.S. Application Data

(63) Continuation of application No. PCT/CN2014/075669, filed on Apr. 18, 2014.

(51) Int. Cl.
| | |
|---|---|
| *C08L 9/00* | (2006.01) |
| *C09D 5/24* | (2006.01) |
| *C09D 5/32* | (2006.01) |
| *H01L 23/552* | (2006.01) |
| *C09D 163/00* | (2006.01) |
| *H01B 1/22* | (2006.01) |
| *H05K 9/00* | (2006.01) |

(52) U.S. Cl.
CPC .............. *C09D 5/32* (2013.01); *C09D 5/24* (2013.01); *C09D 163/00* (2013.01); *H01B 1/22* (2013.01); *H01L 23/552* (2013.01); *H05K 9/0083* (2013.01); *H01L 2224/16225* (2013.01); *H01L 2224/48091* (2013.01); *H01L 2224/73265* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 5,380,806 A | * | 1/1995 | Yano | C08L 63/00 525/481 |
| 5,849,809 A | * | 12/1998 | Narang | B41J 2/1603 522/35 |
| 2003/0015334 A1 | | 1/2003 | Clement et al. | |
| 2008/0045063 A1 | | 2/2008 | Bauer et al. | |
| 2011/0160372 A1 | | 6/2011 | Youm et al. | |
| 2011/0214284 A1 | * | 9/2011 | Xu | H01B 1/22 29/825 |

(Continued)

FOREIGN PATENT DOCUMENTS

| | | |
|---|---|---|
| CN | 1441014 A | 9/2003 |
| CN | 101374403 A | 2/2009 |

(Continued)

*Primary Examiner* — Charles D Garber
*Assistant Examiner* — Xiaoming Liu
(74) *Attorney, Agent, or Firm* — Taylor M. Coon

(57) ABSTRACT

This invention relates to an EMI shielding composition comprising a thermoplastic resin and/or a thermoset resin, a solvent or a reactive diluent and conductive particles providing uniform and homogenous thickness to the EMI shielding layer. The invention also provides a process of applying the EMI shielding layer on the encapsulant protecting the CI device components.

12 Claims, 3 Drawing Sheets

(56) References Cited

U.S. PATENT DOCUMENTS

2013/0331528 A1* 12/2013 Carlborg ................ B81C 3/001
525/477

FOREIGN PATENT DOCUMENTS

| JP | 63-275150 A | 11/1988 |
|---|---|---|
| JP | 7-22541 A | 1/1995 |
| JP | 10-92981 A | 4/1998 |
| JP | 2005314605 A | 11/2005 |
| JP | 2006-335976 A | 12/2006 |
| JP | 2013168399 A | 8/2013 |
| WO | 03053117 A1 | 6/2003 |
| WO | 2012101857 A | 8/2012 |

* cited by examiner

EMI SHIELDING COMPOSITION AND PROCESS FOR APPLYING IT

TECHNICAL FIELD OF THE INVENTION

This invention relates to an EMI shielding composition comprising a thermoplastic resin and/or a thermoset resin, a solvent or reactive diluent and conductive particles providing uniform and homogenous thickness to the EMI shielding layer.

BACKGROUND OF THE INVENTION

Electromagnetic interference (EMI) is disturbance that can degrade or limit the performance of an electrical circuit affected by it. Sources of EMI that may affect a circuit include any object that carries rapidly changing electrical currents. Effectively immunizing a particular device from electromagnetic radiation from an external EMI source, and effectively avoiding damaging or undesirable radiation from a particular device, may require use of an EMI shield. That is, an EMI shield may serve one or both of two purposes: it may be installed over a particular component to shield that component from effects of radiation from external sources or it may be installed over a particular component to prevent radiation originating from the particular component to prevent it affecting surrounding components or devices.

Integrated circuit (IC) device components can be sources of unwanted electromagnetic signals. ICs as such are used in portable electronic devices such as cell phones, and in electronic equipment, including home entertainment equipment and computers. A portable electronic device such as a cell phone typically contains several IC components (which may be IC chips, IC chip packages, or IC package modules) coupled onto a circuit board, and some of these components may generate EM signals that interfere with the operation of other components in the device. EMI shielding may be required to protect circuitry in an electronic component from an external source to the component (including other electronic components).

In one approach to protecting components from EMI, shielding is constructed over the components. The shield is made of an electrically conductive material such as metal sheet (which may be perforated) or metal screen, electrically coupled to a reference potential, which may be ground, for example. It is typically formed as a box or cover installed over the component to be shielded and soldered to contact points on the substrate surrounding the component. Substrate can be such as circuit board. Alternatively, a frame may be soldered to contact points on the substrate, and a sheet metal cover may be snap-coupled to the frame over the component. Undesirably, such a shield adds weight and bulk (thickness, length and width) to the device in which it is used. This approach does not meet current thinner package requirements.

In another approach to constructing a shield, layers of material are applied onto the circuit board and the components by sputtering. Known problems relating the sputtering technique are 1) very low unit per hour (the device need to be sawed before sputtering and each target material needs a long sputtering time); 2) costs relating to the sputtering machine; single sputtering layer thickness is thin (<5 μm), and therefore, usually 2-3 sputtering layers are required; 3) marking related process issues (the laser mark is required before and after the sputtering, there remains some challenges of doing laser mark on the metal based sputtering materials).

Yet in another approach EMI shield is formed by application of the shield material where it is needed to provide the desired shielding effect. Accordingly, less shielding material is required, than would be deployed in a configuration in which the component is fully covered by the shielding material, or in a configuration in which the shield material is applied fully over a broad area including the components and then removed in part from areas where it is not needed, or otherwise to form openings (as in "subtractive" processes).

Yet in another approach the conductive material is coated outside of the device, either by spray coating on the single device external surface or by printing on the half diced package before sawing. Known problems relating to this approach are 1) uneaven coating thickness on the surface and side; 2) high risk of exposing on the package corner and no conductive adhesive coverage; 3) high risk of contamination and also leakage issue during manufacturing; 4) marking related process issue and same as sputtering process; 5) low unit per hour; and 6) high waste levels.

Furthermore, all current processes have some difficulties in the marking process. Currently available laser mark processes cannot be fully used for printing or spray coating types, due the fact that the conductive adhesive is mainly shinning and the mark is not clear. On the other hand for sputtering type, laser mark needs to be done two times before sputtering.

Therefore, it is objective of the present invention to provide an EMI shielding composition which provides solution to at least two of the above mentioned known problems relating to EMI shielding.

SUMMARY OF THE INVENTION

The present invention provides an EMI shielding composition comprising a thermoplastic resin and/or a thermoset resin; a solvent or a reactive diluent; and conductive particles.

The present invention also provides a process of applying the EMI shielding layer on the encapsulant protecting the functional module comprising the following steps: a) preparing the EMI shielding composition according to present invention; b) providing a substrate with one or more functional module attached into it; c) encapsulating said functional modules with an encapsulant; d) applying the EMI shielding composition of step a) by spray coating machine or dispensing/jetting machine to coat said encapsulant; e) a visual check that the EMI shielding coating layer does not contain any defects; f) curing the EMI shielding coating layer; g) cleaning the surface of the EMI shielding coating layer by using solvent followed by optional curing step; h) molding the whole package including the EMI shielding coating layer inside the epoxy molding compound (EMC).

The present invention further encompasses a semiconductor package comprising, a substrate having a grounding element; a functional module disposed on said substrate; an encapsulant encapsulating the functional module; a conductive EMI shielding layer over the encapsulant provided by an EMI shielding composition according to the present invention; and epoxy molding compound cover.

DETAILED DESCRIPTION OF THE INVENTION

Figure 1:
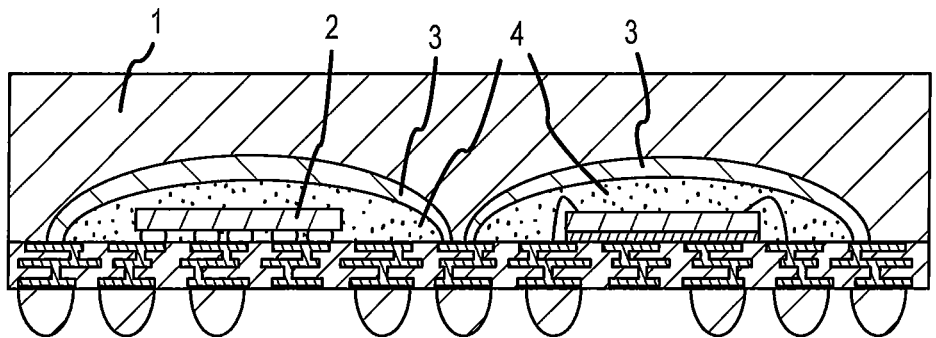
FIG. 1 is an illustration of spray coated or dispensing/jetting coated system in the package (SIP).

In the following passages the present invention is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present invention, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps.

The recitation of numerical end points includes all numbers and fractions subsumed within the respective ranges, as well as the recited end points.

All references cited in the present specification are hereby incorporated by reference in their entirety.

Unless otherwise defined, all terms used in the disclosing the invention, including technical and scientific terms, have the meaning as commonly understood by one of the ordinary skill in the art to which this invention belongs to. By means of further guidance, term definitions are included to better appreciate the teaching of the present invention.

The EMI shielding composition according to the present invention provides a coating inside the package, and said coating can be applied by spray coating or by the dispensing/jetting with self-spreading. It has been found out that the EMI shielding composition according to the present invention is compatible with current package manufacturing processes and there are no laser mark or sawing related process concerns. In addition it has been found that the coating layer thickness and the uniformity of the EMI shielding layer can be controlled. Furthermore, the EMI shielding composition according to the present invention provides a high unit per hour because the used process can be used for the whole substrate while not on the single saw device.

The EMI shielding composition according to the present invention also provides better coverage for the electronic component versus conventionally exposed EMI shielding adhesive. Due the fact that EMI shielding composition according to the present invention provides homogenous thickness and uniformity for the coating layer there are no issues relating to the corner coverage. Furthermore, the composition according to the present invention provides reliable performance on EMI shielding without changing the appearance of the product.

An EMI shielding composition according to the present invention comprises a) a thermoplastic resin and/or b) a thermoset resin; c) a solvent or a reactive diluent; and d) conductive particles.

Each of the essential components of the EMI shielding composition according to the present invention are described in details below.

An EMI shielding composition according to the present invention comprises a combination of a thermoplastic resin and a thermoset resin, or alternatively composition comprises a thermoplastic resin or a thermoset resin alone. Both ingredients will be discussed in details below.

A Thermoplastic Resin

An EMI shielding composition according to the present invention comprises a thermoplastic resin.

A wide variety of known thermoplastic resins can be used in the present invention. The thermoplastic resin may be any thermoplastic resin, preferably a block copolymer. Exemplary suitable thermoplastic resins to be used here in the present invention include acrylic resins, phenoxy resins, thermoplastic polyester resins, polyamide resins, polyurethane resins, polyolefin resins, vinylidene resin, polysulfide rubbers, and nitrile rubbers. Preferably, thermoplastic resin is a phenoxy resin or vinylidene resin or a mixture thereof.

Preferably, the thermoplastic resin is a block copolymer. Block copolymers have higher melting point than homopolymers, and therefore, the thermal stability is higher. At the same time, copolymer resins have better toughness than homopolymers.

Suitable thermoplastic resins to be used in the present invention have a molecular weight Mw greater than 10000, preferably having $M_w$ (average) about 52000 and $M_n$ (average) about 13000.

Preferably the thermoplastic resin is selected from the group consisting of a co-polymer of 1,1,2,3,3,3-hexafluoro-1-propene and 1,1-difluoroethene, co-polymer of 4,4'-propane-2,2-diyldiphenol and 2-(chloromethyl)oxirane (1:1), co-polymer of 4,4'-propane-2,2-diyldiphenol and 2-(chloromethyl)oxirane and mixtures thereof, preferably the thermoplastic resin is co-polymer of 4,4'-propane-2,2-diyldiphenol and 2-(chloromethyl)oxirane (1:1).

Suitable commercially available thermoplastic resins to be used in the present invention are for example PKHH, PKHZ and FC 2178 from Dyneon (Kato Sansho).

An EMI shielding composition according to the present invention comprises a thermoplastic resin from 0.1 to 30% by weight of total weight of the composition, preferably from 0.5 to 20% and more preferably from 1.0 to 10%.

A Thermoset Resin

An EMI shielding composition according to the present invention comprises a thermoset resin.

A wide variety of known thermoset resins can be used in the present invention. Exemplary suitable thermoset resins to be used herein the present invention include vinyl resins, acrylic resins, phenolic resins, epoxy resins, maleimide resins, bismaleimide resins, polyimide resins, and silicon-containing resins and mixtures thereof. Preferably said thermoset resin is selected from epoxy resin and acrylate resin and mixtures thereof.

Suitable thermoset resins to be used herein the present invention have a molecular weight Mw greater than 10000.

Preferably said thermoset resin is selected from the group consisting of oligomer containing 4,4'-isopropylidenediphenol and 1-chloro-2,3-epoxypropane monomers, copolymer of glycidyl methacrylate and methyl methacrylate having an average molecular weight from 200000 to 250000, copolymer of glycidyl methacrylate and methyl methacrylate having an average molecular weight about 10000, N,N-Diglycidyl-4-glycidyloxyaniline and mixtures thereof, preferably thermoset resin is copolymer of glycidyl methacrylate and methyl methacrylate having an average molecular weight from 200000 to 250000.

Suitable liquid thermoset resins to be used in the present invention can be selected from the group consisting of oligomer containing 4,4'-isopropylidenediphenol and 1-chloro-2,3-epoxypropane monomers, 1,4-butanedioldiglycidyl ether, C8-C10 alkyl glycidyl ethers, tetraglycidyl-bis-(p-aminophenyl)-methane and epoxy phenol novolac resin containing formaldehyde and glycidyl ether and mixtures thereof.

Suitable commercially available thermoset resins to be used in the present invention are for example G2050, G1050 from N of Corporation and MX 113 from Kaneka.

An EMI shielding composition according to the present invention comprises thermoset resin from 0.1 to 30% by weight of total weight of the composition, preferably from 0.5 to 20% and more preferably from 1.0 to 12% and most preferably from 2 to 10%.

It is preferred that the total amount of the thermoplastic resin and/or thermoset resin in the EMI shielding composition does not exceed 70% by weight of total weight of the composition. Too high resin quantity in the composition leads to a poor electroconductivity. On the other hand, if the total amount of resin is less than 30% by weight of total weight of the composition, the adhesion properties are negatively affected.

Solvent or Reactive Diluent

An EMI shielding composition according to the present invention comprises a solvent or a reactive diluent. A wide variety of known solvents or reactive diluents can be used in the present invention.

An EMI shielding composition according to the present invention comprises a solvent selected from the group consisting of glycols, alcohols, ethers, esters, carboxylic acids, organo sulphur solvents and mixtures thereof.

Preferably said solvent is selected from the group consisting of dipropylene glycol methyl ether, ethylene glycol monobutyl ether acetate, methyl isobutyl ketone, 2-buthoxy ethanol, diethylene glycol monobutyl ether acetate, 4-methyl-1,3-dioxolane-2-one, dimethyl sulfoxide, N-methyl-2-pyroridone, diethylene glycol monobutyl ether, triethyleneglycol monomethylether, diethyleneglycol ethyl ether acetate, di ethylene glycol monoethyl ether, diethylene glycol monomethyl ether, phenol, terpineol, γ-butyro lactone, ester mixture containing methyl succinate and glutaric acid methyl and dimethyl adipate, butyl glycol acetate and mixtures thereof.

Suitable commercially available solvent to be used in the present invention are for example S-19 from Fischer Scientific and butyl glycol acetate from Spectrum.

Alternatively, the EMI shielding composition according the present invention does not comprise a solvent, but a reactive diluent. A wide variety of reactive diluents can be used in the present invention.

Preferably said reactive diluent is selected from the group consisting of 2-phenoxyethyl acrylate; neodecanic acid-2,3-epoxypropyl ester; 1,4-butanedioldiglycidyl ether; C8-C10 alkyl glycidyl ethers selected from n-butylglycidyl ether and 2-ethylhexyl glycidyl ether; aromatic glycidyl ethers selected from phenyl glycidyl ether, cresyl glycidyl ether and p-s-butylphenyl glycidyl ether, tetraglycidylbis-(p-aminophenyl)-methane; epoxy phenol novolac resin containing formaldehyde and glycidyl ether; styrene oxide and a-pinene oxide; monoepoxide compounds having other functional group(s) selected from allyl glycidyl ether, glycidyl methacrylate, glycidyl acrylate and 1-vinyl-3,4-epoxycyclohexane; a diepoxide compound selected from (poly) ethylene glycol diglycidyl ether, (poly)propylene glycol diglycidyl ether, butanediol diglycidyl ether and neopentyl glycol diglycidyl ether; and a triepoxide compound selected from trimethylolpropane triglycidyl ether and glycerin triglycidyl ether; and mixtures thereof. Preferably reactive diluent is 2-phenoxy ethyl acrylate.

Suitable commercially available reactive diluents to be used in the present invention are for example SR339 from Sartomer.

An EMI shielding composition according to the present invention comprises a solvent or a reactive diluent from 1 to 70% by weight of total weight of the composition, preferably from 40 to 60% and more preferably from 42 to 57%.

It is preferred that the total amount of the solvent or the reactive diluent in the EMI shielding composition according to the present invention does not exceed 70% by weight of total weight of the composition. Too high solvent or reactive diluent quantity in the composition leads to a poor electroconductivity and poor adhesion. On the other hand low solvent or reactive diluent level leads to high viscosity and poor electroconductivity.

Conductive Particles

EMI shielding layer produced by the EMI shielding composition according to the present invention must be electroconductive. Therefore, an EMI shielding composition according to the present invention comprises conductive particles.

Suitable conductive particles can be for example metal particles, metal particles coated with silver or particles made of metal alloys.

Preferably conductive particles are selected from the group consisting of silver coated copper particles; silver coated nickel particles; silver coated aluminium particles; silver coated iron particles; silver particles; aluminium particles; nickel particles; zinc particles; iron particles; gold particles; copper particles; silver coated glass particles; alloy particles made of two or more metals selected from tin, silver, copper, bismuth, antimony, zinc, nickel and indium; silver coated alloy particles made of two or more metals selected from tin, silver, copper, bismuth, antimony, zinc, nickel and indium; and mixtures thereof. Preferably, the conductive particles are silver particles.

Conductive particles, can be in a powder form or in a plate form or mixture of these two. In general, too big particle size leads to uneven surface of the EMI shielding layer and there also may be some small voids or holes in the EMI shielding layer, and therefore, EMI shielding coverage is not full. Whereas, too small particle size leads potential risk of low conductivity and high viscosity.

Preferably, conductive particles is a mixture of particles in powder form and in plate form.

Suitable particles used in the present invention have a particle size preferably greater than 10 nm and they have a mean average particle size less than 75 μm, preferably less than 50 μm.

Suitable commercially available conductive particles to be used in the present invention are for example KP-84 and KP-29 from Ames Goldsmith Corp.; AC4048 from Metalor Technologies; and SF-7E from Ferro.

An EMI shielding composition according to the present invention comprises conductive particles from 10 to 80% by weight of total weight of the composition, preferably from 20 to 60% and more preferably from 25 to 50%, even more preferably from 25 to 45% and most preferably from 30 to 43%.

Optional Ingredients

An EMI shielding composition according to the present invention may comprise further optional ingredients selected from the group consisting of a hardener, a thixotropic index adjuster, an adhesion promoter and a pigment and mixtures thereof.

Hardener

An EMI shielding composition according to the present invention may further comprise a hardener. Suitable hardeners to be used herein the present invention include anhydride-containing compounds; nitrogen-containing compounds such as amine compounds, amide compounds and imidazole compounds; polyfunctional phenols; carboxylic acids and thiols; and combinations thereof. More particularly, the composition may be cured using stoichiometric amounts of a curing agent, such as anhydrides, primary and secondary amines, polyfunctional phenols, carboxylic acids, and thiols; may be cured using non-stoichiometric amounts of catalysts, such as tertiary amines and imidazoles; or may be cured through a combination of such curing agents and catalysts.

Preferably said hardener is selected from the group consisting of 1-cyanoethyl-2-ethyl-4-methylimidazole, blocked amines, modified imidazoles, dodecenyl succinic anhydride and mixtures thereof.

Suitable commercially available hardeners to be used in the present invention are for example Imicure HAPI from Airproducts, EMI-24-CN from PCI Synthesis and EH 2021 from Adeka.

An EMI shielding composition according to the present invention may comprise a hardener from 0.01 to 10% by weight of total weight of the composition, preferably from 0.1 to 5% and more preferably from 0.3 to 4% and most preferably from 0.4 to 2%.

Adhesion Promoter

An EMI shielding composition according to the present invention may further comprise an adhesion promoter. Suitable adhesion promoters to be used herein the present invention include silanes.

Preferably adhesion promoter is selected from the group consisting of (3-glycidyloxypropyl)-trimethoxysilane, γ-methacryloxypropyltrimethoxysilane, bis[3-(triethoxysilyl)-propyl]-tetrasulfide mixtures thereof.

Suitable commercially available adhesion promoters to be used in the present invention are for example Z6040 and Z6030 from Dow Corning; and TS4 from UCT United chemical Technologies.

Thixotrophy Index Adjuster

An EMI shielding composition according to the present invention may further comprise a thixotrophy index adjuster. Suitable thixotrophy index adjusters to be used herein the present invention include silicones and siloxanes such as dimethyl silicone polymer with silica.

Suitable commercially available thixotripic index adjusters to be used in the present invention are for example Cab-O-Sil TS-720 from Cabot Corporation.

An EMI shielding composition according to the present invention may comprise a thixotrophy index adjuster from 0.01 to 10% by weight of total weight of the composition, preferably from 0.5 to 5% and more preferably from 1.5 to 3% and most preferably from 1.75 to 2.75%.

An EMI shielding composition according to the present invention is prepared by the process comprising following steps:

a) dissolving the solid resin into the solvent or into the reactive diluent to form a viscous mixture;
b) following by addition of another resin and conductive particles to form a blend;
c) mixing the blend of step b with Ross Mixer (double planetary mixer) under a vacuum in order to gain homogenous mixture; and
d) addition of any optional ingredient into the blend and mixing.

The present invention uses the EMI shielding composition inside the package. The conductive EMI shielding layer can be produced by spray coating or dispensing/jetting. The EMI shielding composition according to the present invention has slightly different physical properties depending on the application method.

Spray coating type EMI shielding composition according to the present invention has a viscosity at 5 rpm from 100 to 30000 cps, preferably from 300 to 5000 cps, more preferably from 750 to 3250 cps, wherein viscosity is measured according to method described below.

Viscosity is measured by using standard testing method for Brookfield HBDV-III ULTRA with CPE-51 for Electronic Gap Setting Model, therefore, viscosity is measured by using Brookfield HBDV-III ULTRA with CPE-51 for Electronic Gap Setting Model. Testing temperature is set at 25° C.±0.1° C. and kept constant. Testing data is measured at 0.5 RPM and 5 RPM separately.

Thixotrophy index (TI) value is calculated from the ration of data at 0.5 RPM by that at 5RPM (viscosity at 0.5 RPM/viscosity at 5 RPM).

Spray coating type EMI shielding composition according to the present invention has a thixotropic index greater than 1, preferable from 3 to 8.

Spray coating type EMI shielding composition according to the present invention has a yield stress greater than 1, preferable from 2.5 to 8, wherein yield stress is measured according to test method disclosed below Yield stress is measured by using standard testing method for Rheometer AR2000, and therefore, yield stress is measured by using Rheometer AR 2000, from TA Instruments. Casson mode is used to calculate the yield stress.

Spray coating type related EMI shielding composition according to the present invention has a volume resistance (Ohm·cm) less than 1.0E-02 preferably less than <1.0E-04, wherein volume resistance is measured by using 4 point probe method by Agilent 34401A digital Multi-meter.

Dispensing/jetting coating type EMI shielding according to the present invention has a viscosity at 5 rpm from 100 to 300000 cps, preferably from 1000 to 30000 cps, more preferably from 3000 to 15000 cps, wherein viscosity is measured according to test method described above.

Dispensing/jetting coating type EMI shielding composition according to the present invention has a thixotropic index (viscosity at 0.5 rpm/viscosity at 5 rpm) greater than 0, but less than 5, preferable less than 2.5.

Dispensing/jetting coating type EMI shielding composition according to the present invention has a yield stress is greater than 0, but less than 30, preferable less than 10, wherein yield stress is measured according to method described above.

Dispensing/jetting coating type EMI shielding composition according to the present invention has a volume resistance (Ohm·cm) less than 1.0E-02 preferably less than <1.0E-04, wherein volume resistance is measured according to method describe above.

Process of applying the EMI shielding layer on the encapsulant protecting the functional module comprising the following steps:

a) preparing the EMI shielding composition according to present invention;
b) providing a substrate with one or more functional module attached into it;
c) encapsulating said one or more functional modules with one or more encapsulant;
d) applying the EMI shielding composition of step a) by spray coating machine or dispensing/jetting machine to coat said one or more encapsulant;
e) a visual check that the EMI shielding coating layer does not contain any defects;
f) curing the EMI shielding coating layer;
g) cleaning the surface of the EMI shielding coating layer by using solvent followed by optional curing step;
h) molding the whole package including the EMI shielding coating layer inside the epoxy molding compound (EMC).

A functional module is preferably selected from the group consisting of a semiconductor chip, single or multiple IC components/package, system in package (SIP), flip chip device, embedded multimedia card (eMMC) and mixtures thereof.

An encapsulant which is placed to protect the functional module can be any suitable material for use in electronic devices. Preferably the encapsulant is plastic resin encapsulant. Preferably the encapsulant is non-conductive material.

The process according to the present invention allows to provide EMI shielding layer prior to the molding process. Currently in most of the cases EMI Shielding layer is outside the package, and this execution has issue with low UPH, when EMI shielding layer is applied by spray coating. In addition, corner coverage issue remains in this execution. Furthermore, when the EMI shielding layer is outside the package, there may be EMI issues inside the package. The present invention has high UPH and there is no corner coverage issues. Furthermore, EMI issues inside the package are solved, due the feature that the EMI shielding is inside the package.

The process according to the present invention provides a standard laser mark after molding, and therefore the process is compatible with current standard processes.

When the EMI shielding layer is applied by using spray coating, the coating temperature is from 10° C. to 150° C., preferably from 25° C. to 100° C. At the same time thickness of the applied EMI shielding layer is from 0.1 µm to 2000 µm, preferably from 5 µm to 250 µm. The thickness of the cured EMI shielding layer, which is applied by spray coating, is from 0.1 µm to 200 µm, preferably from 1 µm to 75 µm.

When the EMI shielding layer is applied by using dispending/jetting coating, the coating temperature is from 10° C. to 150° C., preferably from 25° C. to 100° C. At the same time thickness of the applied EMI shielding layer is from 0.1 µm to 1000 µm, preferably from 5 µm to 200 µm. The thickness of the cured EMI shielding layer, which is applied by dispensing/jetting coating is from 0.1 µm to 200 µm, preferably from 1 µm to 75 µm.

A semiconductor Package

The present invention also encompasses a semiconductor package comprising, a) a substrate having a grounding element; b) a functional module disposed on said substrate; c) an encapsulant encapsulating the functional module; d) a conductive EMI shielding layer over the encapsulant provided by an EMI shielding composition according to the present invention; and e) epoxy molding compound cover.

The process of applying EMI shielding layer according to the present invention is compatible with current processes and does not have any negative side effects to the device to be shielded.

FIG. 1 illustrates a spray coated or dispensing/jetting coated system in package (SIP). Referring to FIG. 1, which illustrates a cross sectional view of semiconductor device package implemented in accordance with one embodiment of the present invention, package includes epoxy molding compound (1), flip chip device (2), encapsulant on controller (4), and EMI shielding layer (3) according to the present invention.

Figure 2:
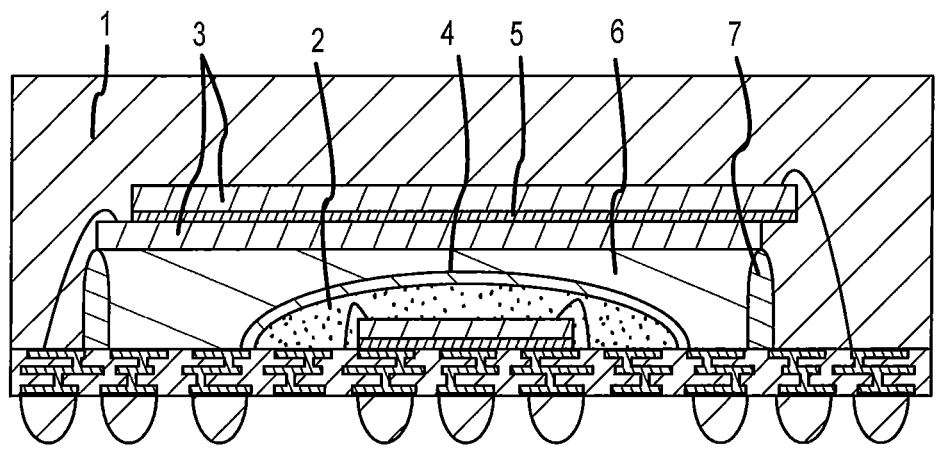
FIG. 2 is an illustration of spray coated or dispensing/jetting coated EMI shielding conductive adhesive in embedded Multi-Media Card (eMMC) package.

FIG. 2 illustrates a spray coated or dispensing/jetting coated EMI shielding conductive adhesive in embedded Multi-Media Card (eMMC) package. Referring to FIG. 2, which illustrates a cross sectional view of Multi-Media Card (eMMC) package implemented in accordance with one embodiment of the present invention, package includes epoxy molding compound (1), encapsulant on controller (2), memory die (3), EMI shielding layer (4) according to the present invention, DDF (5), fill (6) and DAM (7).

Figure 3:
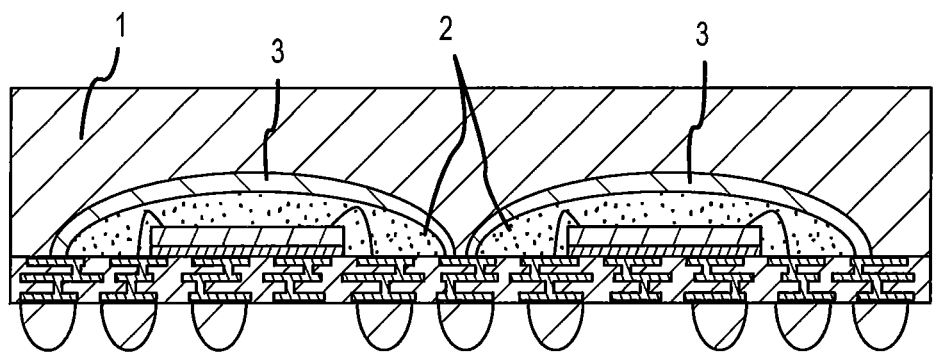
FIG. 3 is an illustration of spray coated or dispensing/jetting coated normal radio frequency or WiFi multi die package.

FIG. 3 illustrates spray coated or dispensing/jetting coated normal radio frequency or WiFi multi die package. Referring to FIG. 3, which illustrates a cross sectional view of radio frequency or WiFi multi die package implemented in accordance with one embodiment of the present invention, package includes epoxy molding compound (1), encapsulant on controller (2), and EMI shielding layer (3) according to the present invention.

EXAMPLES

Spray Coating Type Formulations:

| Raw material | Example 1 | Example 2 | Example 3 | Example 4 | Example 5 |
|---|---|---|---|---|---|
| Thermoplastic resin FC 2178 | 7.07 | 4.5 | 1.19 | 7.07 | 4.5 |
| Thermoset resin P7200H | 2.30 | | | 2.3 | |
| Thermoset resin MX113 | | 4.5 | 9.48 | | 4.5 |
| Hardener HAPI | 0.42 | | | 0.42 | |
| Hardener EMI-24-CN | | 0.8 | 1.90 | | 0.8 |
| silver AC 4048 | 35.00 | 35 | | 35 | 35 |
| LTD silver KP-84 | | | 41.48 | | |
| T.I. adjuster TS720 | 2.21 | 2.20 | 2.61 | 2.21 | 2.21 |
| Solvent S-19 | 53.00 | 53 | 43.34 | | |
| Diluent SR339 | | | | 53 | 53 |

Thermoplastic resins FC 2178 from Dyneon (Kato Sansho). Thermoset resin MX 113 from Kaneka and Araldite MY 0510 from Huntsman. Solvent S-19 from Fischer Scientific. Conductive particles KP-84 from Ames Goldsmith Corp., AC4048 from Metalor Technologies. Hardeners Imicure HAPI from Airproducts, EMI-24-CN from PCI Synthesis from Adeka. Thixotripic index adjuster TS720 from Cabot, SR339 from Sartomer.

Properties of Examples 1-5

|  | Example 1 | Example 2 | Example 3 | Example 4 | Example 5 |
|---|---|---|---|---|---|
| Viscosity @ 5 RPM (cps) | 3000 | 1000 | 1500 | 3200 | 1450 |
| Viscosity @ 0.5 RPM (cps) | 15000 | 7400 | 11700 | 18000 | 9800 |
| TI of final | 5.0 | 7.4 | 7.8 | 5.63 | 6.76 |
| Yield Stress (Pa) | 4.3 | 2.5 | 5.1 | 4.6 | 4.8 |
| Volume resistance (Ohm.cm) | 6.00E−05 | 5.00E−05 | 2.00E−05 | | |
| DSC Onset Ohm.cm Peak | 128.3 148.5 | 124.6 145.5 | 125.3 147.7 | | |

Figure 4:
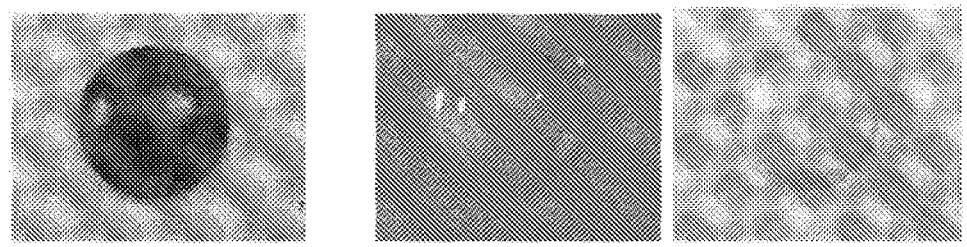
FIG. 4 is an illustration of composition of example 1 before coating, after coating and after curing.

The viscosity of example 1 is lower than the viscosity of traditional conductive adhesive, this is due the requirement of spray coating application. Flash point of the solvent and onset of DSC is more than 100° C., and therefore, the sample can be heated during spray coating. High TI of the sample makes the conductive adhesive to keep its shape. FIG. 4 is illustrating example 1 before coating, after coating and after curing. FIG. 4 shows that example 1 covers the encapsulant very well.

Figure 5:
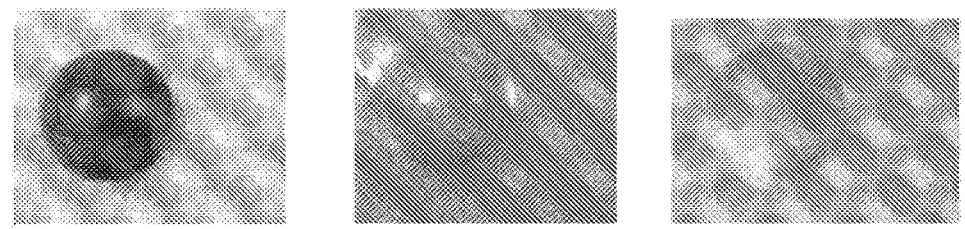
FIG. 5 is an illustration of composition of example 2 before coating, after coating and after curing.

The viscosity of this example 2 is lower than the viscosity of example 1, and therefore, it is very suitable for spray coating application. Flash point of the solvent and onset of DSC is more than 100° C., and therefore, the sample can be heated during spray coating. Small molecular resin and silver particles having extremely low tap density help to improve the TI of the composition, and the EMI shielding conductive adhesive keeps its shape even at very low viscosity. FIG. 5 is illustrating example 2 before coating, after coating and after curing. The FIG. 5 shows that example 1 covers the encapsulant very well.

Figure 6:
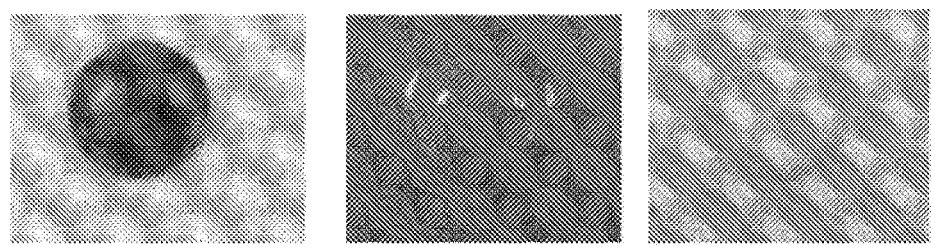
FIG. 6 is an illustration of composition of example 3 before coating, after coating and after curing.

Example 3 has lower viscosity and higher TI. At the same time, the solvent content is lower compared to the examples 1 and 2. These properties helps to gain a thicker layer after curing. Furthermore, high content of the thermoset resin helps to improve the conductive performance of the example 3. Flash point of the solvent and onset of DSC is more than 100° C., and therefore, the sample can be heated during spray coating. FIG. 6 is illustrating example 3 before coating, after coating and after curing. FIG. 6 shows that example 1 covers the encapsulant very well.

Dispensing/Jetting Type of Formulations:

| Raw material | Example 6 | Example 7 | Example 8 | Example 9 |
|---|---|---|---|---|
| Thermoplastic resin FC 2178 | 8.74 | | 3.95 | 3.95 |
| Thermoplastic resin PKHH | | 8.74 | | |
| Thermoset resin P7200H | | | 4.18 | 4.18 |
| Hardener EMI-24-CN | | | 0.61 | 0.61 |
| Silver AC 4048 | | 33.93 | | |
| Silver C-1891P | | 8.0 | 6.1 | 6.1 |
| LTD silver KP-84 | 35.93 | | | |
| LTD silver KP-29 | | | 31.61 | 31.61 |
| Solvent S-19 | 55.33 | 49.33 | 53.55 | |
| Diluent 2-phenoxy ethyl acrylate SR339 | | | | 53.55 |

Thermoplastic resins PKHH and FC 2178 from Dyneon (Kato Sansho). Thermoset resin P7200H from DIC. Solvent S-19 from Fischer Scientific. Conductive particles KP-84 and KP-29 from Ames Goldsmith Corp.; AC4048 from Metalor Technologies, and C-1891P from Metalor. Hardeners Imicure HAPI from Airproducts, EMI-24-CN from PCI Synthesis; SR339 from Sartomer.

Properties of Examples 6-9

|  | Example 6 | Example 7 | Example 8 | Example 9 |
|---|---|---|---|---|
| Viscosity @ 5 RPM (cps) | 3200 | 11000 | 3400 | 3800 |
| Viscosity @ 0.5 RPM (cps) | 6500 | 10400 | 4900 | 5200 |
| TI of final | 2.03 | 0.95 | 1.44 | 1.37 |
| Yield Stress (Pa) | 0.95 | 0.37 | 0.71 | 0.74 |
| Volume resistance (Ohm.cm) | 5.00E−05 | 7.00E−05 | 3.00E−05 | |

Figure 7:
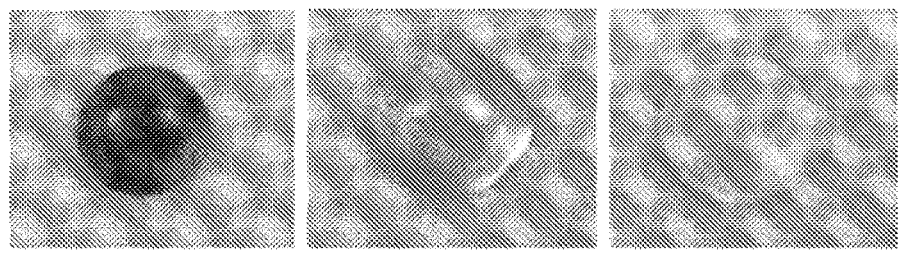
FIG. 7 is an illustration of composition of example 6 before jetting, after jetting and after curing.

Example 6 has lower viscosity and TI. After the conductive adhesive is dispensed or jetted to the top of the encapsulant, it can self spread and cover the encapsulant. FIG. 7 is an illustration of example 6 before jetting, after jetting and after curing. FIG. 7 shows that example 6 covers the encapsulant very well.

Figure 8:
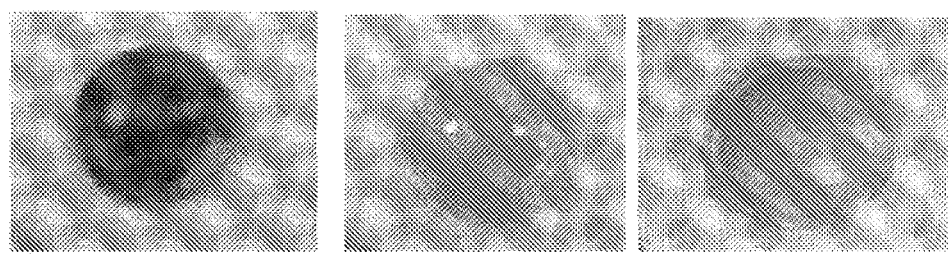
FIG. 8 is an illustration of composition of example 7 before jetting, after jetting and after curing.

Example 7 has extremely low TI, and therefore, it self-spreads easily and covers the encapsulant. High content of the silver particles and low content of the solvent help to gain a thicker layer after curing. FIG. 8 is an illustration of example 7 before jetting, after jetting and after curing. FIG. 8 shows that example 7 covers the encapsulant very well.

Figure 9:
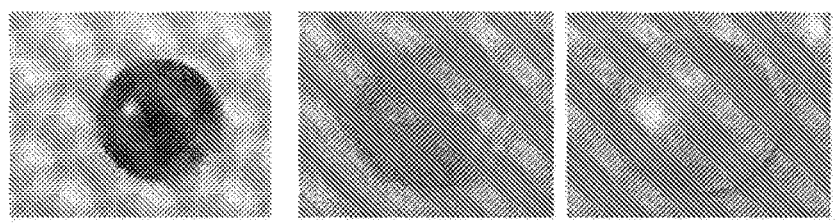
FIG. 9 is an illustration of composition of example 8 before jetting, after jetting and after curing.

Example 8 comprises a high molecular thermoset resin in order to provide the low TI and good spreading ability. At the same time, the electrical conductive and reliability are better. FIG. 9 is an illustration of example 8 composition before jetting, after jetting and after curing. FIG. 9 shows that example 8 covers the encapsulant very well.

Example 10 exemplifies composition according to present invention with silver coated copper particles.

|  | Example 10 |
|---|---|
| Epichlorohydrin-phenol formaldehyde Epcilon (830S from Dainippon Ink & Chemical) | 2.966 |
| Maleinized polybutadiene (Ricon 130 MA 20 from Sartomer) | 1.695 |
| Beta-(3,4-epoxycyclohexyl)-ethyl-trimethoxy silane (Silquest A-186 from Momentive Performance Materials) | 0.106 |
| Bismaleimide resin from Henkel | 3.940 |
| Tetrahydrofurfuryl acrylate (SR285 from Sartomer) | 0.891 |
| Dicumyl peroxide or Bis-dimethylbenzyl peroxide from Sigma-Aldrich | 0.106 |
| Di-trimethylolpropane tetraacrylate (SR355 from Sartomer) | 2.118 |
| Monoalkoxytitanate (Ken-React KR-TTS from Kentrich Petrochemicals) | 0.064 |

-continued

|  | Example 10 |
|---|---|
| HAPI curing agent from Air Products & Chemical | 0.148 |
| 2-(2-Ethoxyethoxy)ethyl acetate or Diethlyene glycol monethyl ether acetate from Fischer Scientific | 6.017 |
| Ag particles (KP-84 from Technic) | 8.929 |
| Ag coated Cu particles (AgCu0204(20%) from Ferro) | 73.020 |

Properties of Example 10

|  | Example 10 |
|---|---|
| Viscosity at 0.5 rpm | 5800 |
| Viscosity at 5 rpm | 3980 |
| TI value | 1.5 |
| Yield stress (Pa) | 0.6 |
| Volume Resistance (Ohm.cm) | 0.00031 |

The invention claimed is:

1. An EMI shielding composition comprising
a) an thermoplastic resin and/or a thermoset resin;
b) a solvent or reactive diluent; and
c) conductive particles,
wherein the solvent is selected from the group consisting of dipropylene glycol methyl ether, ethylene glycol monobutyl ether acetate, methyl isobutyl ketone, 2-buthoxy ethanol, diethylene glycol monobutyl ether acetate, 4-methyl-1,3-dioxolane-2-one, dimethyl sulfoxide, N-methyl-2-pyroridone, diethylene glycol monobutyl ether, triethyleneglycol monomethylether, diethyleneglycol ethyl ether acetate di ethylene glycol monoethyl ether, diethylene glycol monomethyl ether, phenol, terpineol γ-butyro lactone ester mixture containing methyl succinate and glutaric acid methyl and dimethyl adipate, butyl glycol acetate and mixtures thereof,
wherein the reactive diluent is selected from the group consisting of 2-phenoxyethyl acrylate: neodecanic acid-2,3-epoxy-propyl ester; 1,4-butanedioldiglycidyl ether; C8-C10 alkyl glycidyl ethers selected from n-butylglycidyl ether and 2-ethylhexyl glycidyl ether: aromatic glycidyl ethers selected from phenyl glycidyl ether, cresyl glycidyl ether and p-s-butylphenyl glycidyl ether, tetraglycidylbis-(p-aminophenyl)-methane; epoxy phenol novolac resin containing formaldehyde and glycidyl ether; styrene oxide and a-pinene oxide: monoepoxide compounds having other functional groups) selected from allyl glycidyl ether, glycidyl methacrylate, glycidyl acrylate and 1-vinyl-3,4-epoxycyclohexane; a diepoxide compound selected from (poly)ethylene glycol diglycidyl ether, (poly)propylene glycol diglycidyl ether, butanediol diglycidyl ether and neopentyl glycol diglycidyl ether; and a triepoxide compound selected from trimethylolpropane triglycidyl ether and glycerin triglycidyl ether; and mixtures thereof,
wherein the conductive particles are selected from the group consisting of silver coated copper particles; silver coated nickel particles; silver coated aluminium particles; silver coated iron particles; silver particles: aluminium particles; nickel particles; zinc particles: iron particles; gold particles; copper particles: silver coated glass particles; alloy particles made of two or more mixtures from tin, silver copper, bismuth, antimony, zinc, nickel and indium; silver coated alloy particles made of two or more metals selected from tin, silver, copper, bismuth, antimony, zinc, nickel and indium; and mixtures thereof.

2. The EMI shielding composition according to claim 1, wherein said thermoplastic resin is selected from the group consisting of acrylic resins, phenoxy resins, thermoplastic polyesters, polyamides, vinylidene resin, polyurethanes, polyolefins, polysulfide rubbers, and nitrile rubbers and mixtures thereof.

3. The EMI shielding composition according to claim 1, wherein said thermoplastic resin is selected from the group consisting of a co-polymer of 1,1,2,3,3,3-hexafluoro-1-propene and 1,1-difluoroethene, co-polymer of 4,4'-propane-2,2-diyldiphenol and 2-(chloromethyl)oxirane (1:1), co-polymer of 4,4'-propane-2,2-diyldiphenol and 2-(chloromethyl)oxirane and mixtures thereof.

4. The EMI shielding composition according to claim 1, wherein said composition comprises thermoplastic resin from 0.1 to 30% by weight of total weight of the composition.

5. The EMI shielding composition according to claim 1, wherein said thermoset resin is selected from the group consisting of vinyl resins, acrylic resins, phenolic resins, epoxy resins, maleimide resins, bismaleimide resins, polyimide resins, and silicon-containing resins and mixtures thereof.

6. The EMI shielding composition according to claim 1, wherein said thermoset resin is selected from the group consisting of oligomer containing 4,4'-isopropylidenediphenol and 1-chloro-2,3-epoxypropane monomers, copolymer of glycidyl methacrylate and methyl methacrylate having an average molecular weight from 200000 to 250000, copolymer of glycidyl methacrylate and methyl methacrylate having an average molecular weight about 10000, N,N-Diglycidyl-4-glycidyloxyaniline and mixtures thereof.

7. The EMI shielding composition according to claim 1, wherein said composition comprises thermoset resin from 0.1 to 30% by weight of total weight of the composition.

8. The EMI shielding composition according to claim 1, wherein said reactive diluent is 2-phenoxy ethyl acrylate.

9. The EMI shielding composition according to claim 1, wherein said composition comprises a solvent from 1 to 70% by weight of total weight of the composition.

10. The EMI shielding composition according to claim 1, wherein said composition comprises conductive particles from 10 to 80% by weight of total weight of the composition.

11. A process of applying an EMI shielding layer on the encapsulant protecting the functional module comprising the following steps:
a) preparing the EMI shielding composition according to claim 1;
b) providing a substrate with one or more functional module attached into it;
c) encapsulating said one or more functional modules with one or more encapsulant;
d) applying the EMI shielding composition of step a) by spray coating machine or dispensing/jetting machine to coat the encapsulant;
e) a visual check that the EMI shielding coating layer does not contain any defects;
f) curing the EMI shielding coating layer;
g) cleaning the surface of the EMI shielding coating layer by using solvent followed by optional curing step; and h) molding the whole package including the EMI shielding coating layer inside the epoxy molding compound (EMC).

12. A semiconductor package comprising
a) a substrate having a grounding element;
b) a functional module disposed on said substrate;
c) an encapsulant encapsulating said functional module;
d) a conductive EMI shielding layer over the encapsulant provided by a EMI shielding composition according to claim 1; and
e) epoxy molding compound cover.

* * * * *

UNITED STATES PATENT AND TRADEMARK OFFICE
CERTIFICATE OF CORRECTION

PATENT NO. : 10,287,444 B2
APPLICATION NO. : 15/296178
DATED : May 14, 2019
INVENTOR(S) : Wangsheng Fang and Wei Yao It is certified that error appears in the above-identified patent and that said Letters Patent is hereby corrected as shown below:

In the Specification

Column 5, Line 24: Change "N of Corporation" to "Nof Corporation".

Signed and Sealed this
Twenty-fourth Day of December, 2019

Andrei Iancu
*Director of the United States Patent and Trademark Office*